(12) United States Patent
Goodwin et al.

(10) Patent No.: US 9,977,343 B2
(45) Date of Patent: May 22, 2018

(54) CORRECTION OF ERRORS CAUSED BY AMBIENT NON-UNIFORMITIES IN A FRINGE-PROJECTION AUTOFOCUS SYSTEM IN ABSENCE OF A REFERENCE MIRROR

(71) Applicant: Nikon Corporation, Tokyo (JP)

(72) Inventors: Eric Peter Goodwin, Tucson, AZ (US); Daniel Gene Smith, Tucson, AZ (US)

(73) Assignee: NIKON CORPORATION, Tokyo (JP)

( * ) Notice: Subject to any disclaimer, the term of this patent is extended or adjusted under 35 U.S.C. 154(b) by 142 days.

(21) Appl. No.: 14/480,810

(22) Filed: Sep. 9, 2014

(65) Prior Publication Data

US 2015/0070670 A1    Mar. 12, 2015

Related U.S. Application Data

(60) Provisional application No. 61/875,967, filed on Sep. 10, 2013.

(51) Int. Cl.
*G03B 27/34* (2006.01)
*G03F 7/20* (2006.01)
*G02B 7/32* (2006.01)
*G02B 7/36* (2006.01)

(52) U.S. Cl.
CPC ........... *G03F 7/70641* (2013.01); *G02B 7/32* (2013.01); *G02B 7/365* (2013.01)

(58) Field of Classification Search
CPC ..... G03F 7/70641; G03F 9/7026; G02B 7/32; G02B 7/365

USPC .......................................................... 355/56
See application file for complete search history.

(56) References Cited

U.S. PATENT DOCUMENTS

| 5,144,363 | A | * | 9/1992 | Wittekoek | .......... | G03F 7/70241 |
|---|---|---|---|---|---|---|
| | | | | | | 355/53 |
| 5,528,118 | A | | 6/1996 | Lee | | |
| 5,623,853 | A | | 4/1997 | Novak et al. | | |
| 5,668,672 | A | | 9/1997 | Oomura | | |
| 5,689,377 | A | | 11/1997 | Takahashi | | |
| 5,835,275 | A | | 11/1998 | Takahashi et al. | | |
| 5,874,820 | A | | 2/1999 | Lee | | |
| 5,892,117 | A | | 4/1999 | Theriot | | |
| 8,223,345 | B2 | | 7/2012 | Hidaka et al. | | |
| 8,411,249 | B2 | | 4/2013 | Hidaka et al. | | |
| 8,502,978 | B2 | | 8/2013 | Hidaka | | |
| 8,599,387 | B2 | | 12/2013 | Hidaka | | |
| 8,705,170 | B2 | | 4/2014 | Williamson et al. | | |

(Continued)

FOREIGN PATENT DOCUMENTS

WO    2012177663 A3    12/2012

*Primary Examiner* — Peter B Kim
(74) *Attorney, Agent, or Firm* — Yakov S. Sidorin; Quarles & Brady LLP

(57) ABSTRACT

Fringe-projection autofocus system devoid of a reference mirror. Contributions to error in determination of a target surface profile caused by air non-uniformities measured based on multiple measurements of the target surface performed at different wavelengths, and/or angles of incidence, and/or grating pitches and subtracted from the measured profile, rendering the system substantially insensitive to presence of air turbulence. Same optical beams forming a fringe irradiance pattern on target surface are used for measurement of the surface profile and reduction of measurement error by the amount attributed to air turbulence.

11 Claims, 10 Drawing Sheets

(56) References Cited

U.S. PATENT DOCUMENTS

| | | |
|---|---|---|
| 2004/0165169 A1* | 8/2004 | Teunissen ............. G03F 9/7034 355/67 |
| 2011/0071784 A1 | 3/2011 | Smith et al. |
| 2012/0008150 A1 | 1/2012 | Smith et al. |
| 2013/0188084 A1 | 7/2013 | Goodwin |
| 2013/0308140 A1 | 11/2013 | Goodwin et al. |
| 2013/0330662 A1 | 12/2013 | Goodwin |
| 2014/0049761 A1 | 2/2014 | Goodwin et al. |
| 2014/0233011 A1 | 8/2014 | Goodwin |

* cited by examiner

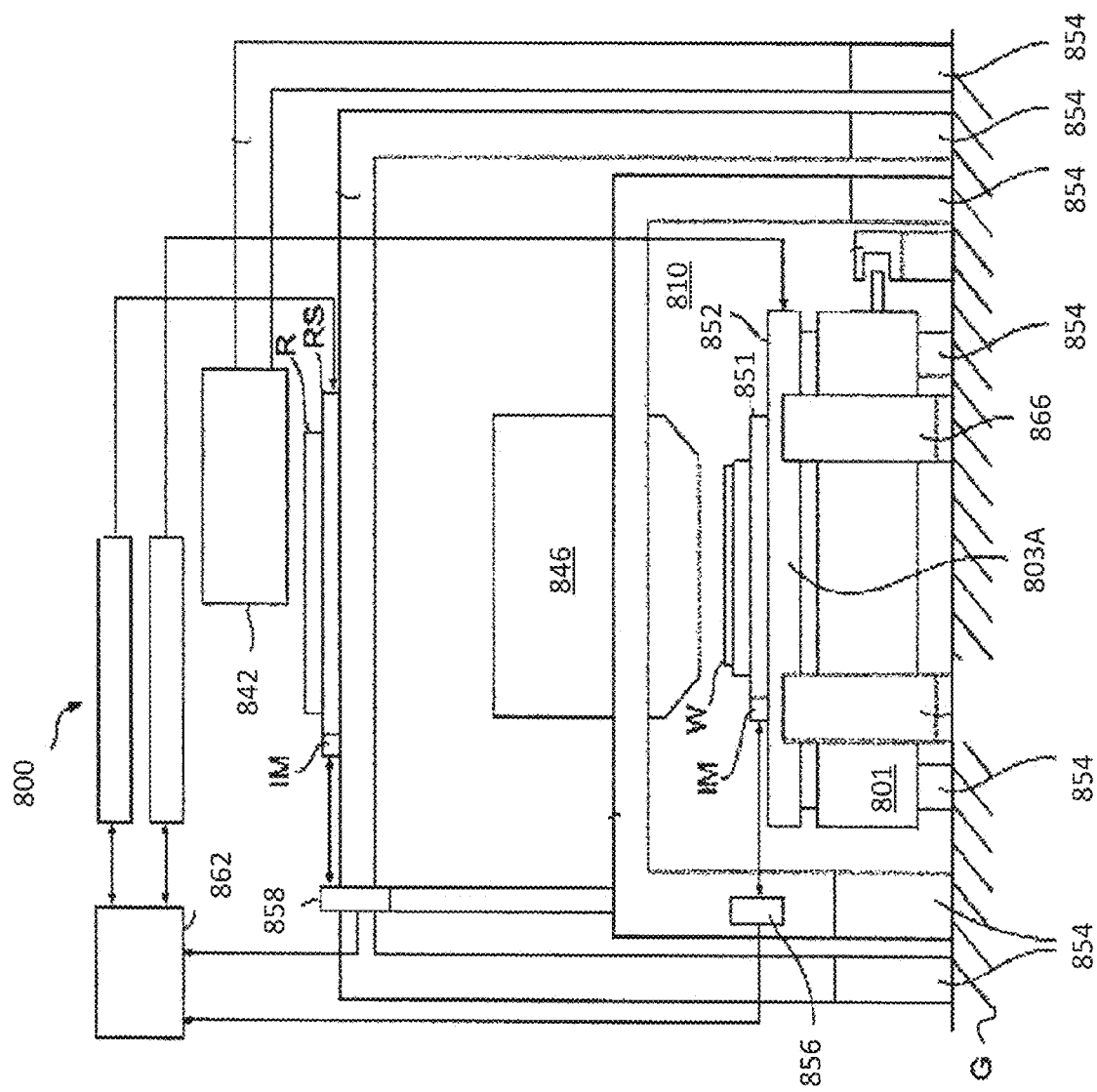

CORRECTION OF ERRORS CAUSED BY AMBIENT NON-UNIFORMITIES IN A FRINGE-PROJECTION AUTOFOCUS SYSTEM IN ABSENCE OF A REFERENCE MIRROR

CROSS-REFERENCE TO RELATED APPLICATIONS

The present application claims benefit of and priority from the U.S. Provisional Patent Application No. 61/875,967 filed on Sep. 10, 2013 and titled "Correction for Errors Caused by Air Turbulence in a Fringe-Projection Autofocus System in Absence of a Reference Mirror". The disclosure of the above-identified provisional patent application is incorporated herein by reference.

TECHNICAL FIELD

The present invention relates generally to an optical autofocus system for a lithographic exposure tool and, in particular, to an autofocus system employing a fringe-projection system causing an output that is indicative of a spatial displacement of a surface of a target of the autofocus system.

BACKGROUND

Non-uniformities of optical paths such as those caused by heterogeneity of the ambient environment—for example, air turbulence due to air movement or non-uniformities of the refractive index—continue to present a practical problem for operation of an optical autofocus (AF) system (unless such a system is completely sealed off from the environment, which is costly and not always practically feasible for operation). The presence of air turbulence, for example, manifests in changes in the phase acquired by light propagating through the fringe-projection system of an optical autofocus system on its way to the detector, and, therefore, substantially un-quantifiably contributes to the error in the measurement of a target surface profile. As the degree of accuracy and precision of the operation of the AF systems continues to improve, there remains an unmet need in an operational modality that enables to identify the air-turbulence related measurement error, controllably and with a known degree of certainty.

SUMMARY OF THE INVENTION

Embodiments of the invention provide a system that includes a profile-generating element configured to generate a profile of a target surface from optical data derived from two or more selected optical parameters associated with an irradiance pattern formed on the target surface, the optical parameters selected to be indicative of the ambient air turbulence around the target surface so that profiling errors induced in the profile by the ambient air turbulence are at least partially reduced.

Embodiments of the invention provide a lithographic autofocus system that includes (i) an optical projection system structured to project an irradiance pattern representing interference fringes onto a target surface and characterized by opto-geometrical parameters (in a specific case, an interference pattern formed by two plane waves), and (ii) data-processing circuitry configured to generate data that represent a profile of said target surface, in which profile the errors (that are associated with differences between at least two optical paths defined by the optical projection system and caused by non-uniformity of air, and that are calculated based only on said opto-geometrical parameters and data representing said irradiance pattern) are at least partially reduced.

Embodiments of the invention additionally provide a lithographic autofocus system that includes an optical projection system containing a diffraction grating to define interference fringes on a target surface by projecting at least two optical beams formed by said diffraction grating from light incident thereon. The lithographic autofocus system additionally includes a detection system that contains data-processing circuitry and that is disposed (a) to receive images of the interference fringes at multiple wavelengths and (b) to determine, based on direct measurement of the received images, phase data that are associated with an optical path length variation (as measured between such at least two optical beams) caused by non-uniformity of air. The lithographic autofocus system of the embodiments of the invention is devoid of (i.e., does not contain) a conventionally-used reference mirror.

BRIEF DESCRIPTION OF THE DRAWINGS

The invention will be more fully understood by referring to the following Detailed Description in conjunction with the generally not-to-scale Drawings, of which:

FIG. 8 is a diagram illustrating schematically a structure of an exposure tool;

DETAILED DESCRIPTION

Figure 1:
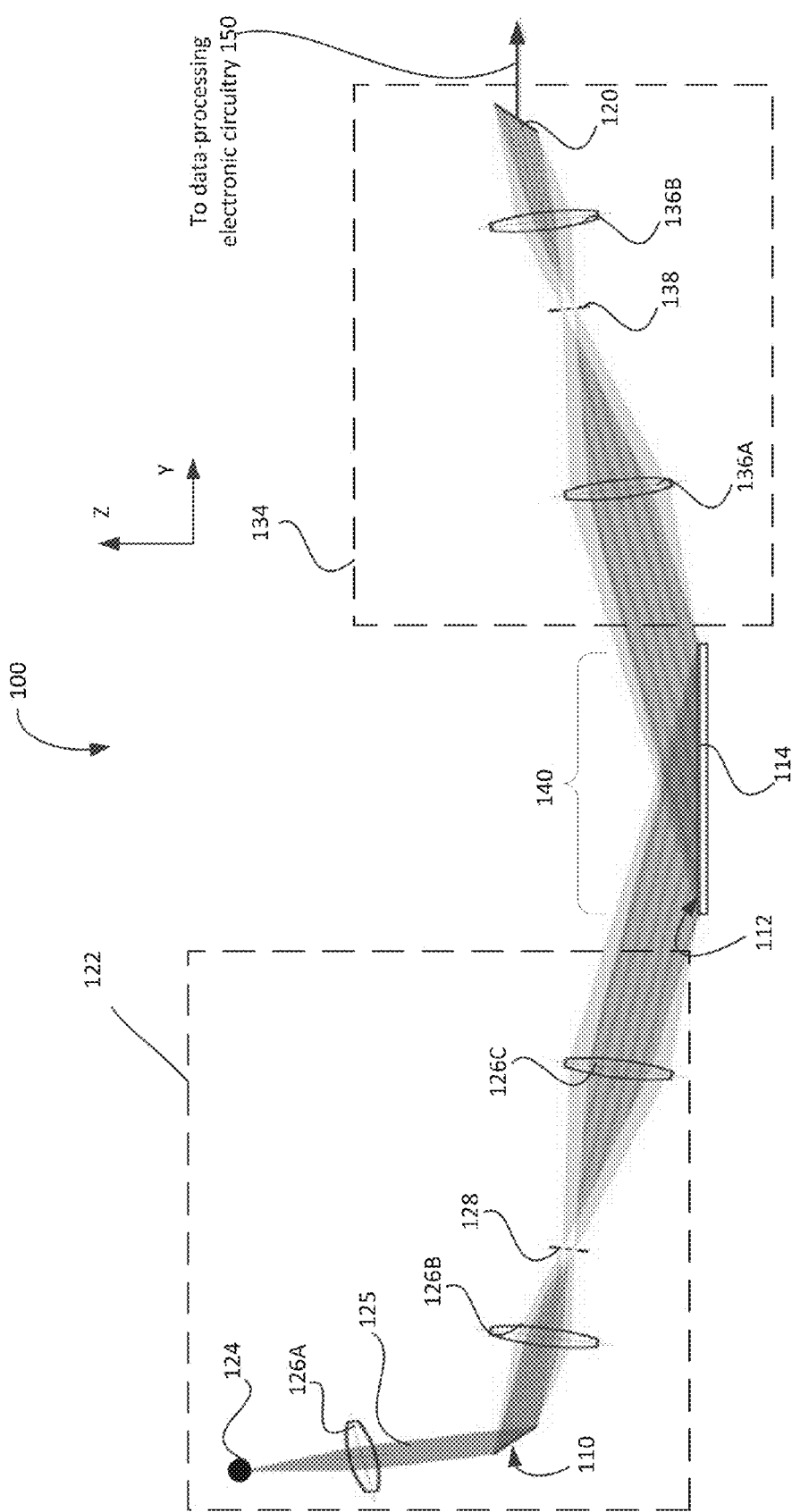
FIG. 1 is a diagram schematically presenting a fringe-projection sub-system of the autofocus-adjusting surface profiling system, which benefits from the implementation of an embodiment of the present invention.

An autofocus (AF) device or system (also interchangeably referred to herein as an auto-focus-adjusting system)

employs one or more sensors to collect data used to control, mechanically or electromechanically, the adjustment of focus of the optical system or, alternatively the working distance at which the identified element of the optical system is positioned with respect to the target during the operation. In lithographic equipment, for example, the AF system is often employed to maintain the identified target surface associated with the semiconductor wafer in focus of the optical system (for example, a projection lens) during the wafer-exposure procedure. Such AF-operation can rely on the use of a reference beam of light bounced or reflected from a reference surface or mirror disposed along the target surface that is subject to measurement. The optical path(s) that measurement beam(s) of light (used for the measurement of the profile of the target surface) and a reference beam follow through the system are substantially long, which is defined by the practical configuration of a typical AF system. Such optical paths, therefore, are inevitably subject to measurement errors caused by non-uniformities of the ambient environment (for example, by slowly moving air) that, in practice, is difficult and costly to eliminate. Even when substantial measures are taken to reduce the magnitude of these errors (for example, through high levels of environmental control), the non-uniformities of the ambient environment can still cause errors that are larger than can be tolerated. In the future, the allowable level of these errors will continue to decrease. The ubiquity of such errors, the values of which are becoming comparable to the range of required focus correction as the accuracy and precision of the AF modalities continue to increase, begs a question of whether it is possible to compensate for or negate such measurement errors based on the measurement itself, without making the costly and operationally-impractical attempts to reduce the ever-present air flow.

The present invention addresses a problem of assessing a contribution of errors, caused by non-uniformities of ambient environment, to determination of a profile of a target surface in an AF system. Conventional fringe-projection systems employing a reference reflector simply cannot work perfectly in terms of assessing ambient-caused errors, because optical paths, through the fringe-projection system, of beams interacting with the reference reflector differ substantially from optical paths of beams interacting with the target surface, because in an embodiment of the currently used fringe-projection AF system the reference reflectors is substantially displaced from the target surface. Generally, embodiments of the present invention solve this problem by making the required assessment based on optical data representing light that has interacted with the target surface as part of the fringe-projection operation and (in stark contradistinction with related art) without relying on additional reference data conventionally sought after and acquired from a reference beam that does not interact with the target surface and is redirected to the optical detector by a reference reflector. Because the optical paths charted by the measurement beams of a system of the present invention are nearly identical and/or equal (as discussed below), operational performance of an embodiment structured according to the idea of the present invention in inherently better than that of the systems of related art, in that the errors caused by the non-uniformities of the ambient are substantially reduced and/or nullified. Accordingly, the present embodiments advantageously render a reference reflector of an AF system operationally unnecessary, which simplifies the structure of the AF system in comparison with AF system of related art. More specifically, the present solution is achieved by performing multiple measurements, the respective sensitivities of which to air non-uniformity (turbulence) are different from one another and based on which the contribution to the overall measurement error caused by air turbulence or air-index fluctuations is, first, empirically quantified and then subtracted from the overall measurement outcome hereby rendering an AF system substantially insensitive to index fluctuations of air.

It will be understood from the discussion presented below that measurement errors, caused by air-turbulence or air-non-uniformity effects and manifesting in erroneous perception of changes in a profile of a target surface, principally differ from errors related to uncertainty of such target surface profile. Such distinction stems from the fact that the former are subject to local spatial distribution of air-non-uniformities and generally affect differently the measurement beams corresponding to light beams of different orders of diffraction upon the propagation through the AF-system, while the latter are common and substantially the same for the light beams corresponding to different orders of diffraction and depend mostly on the geometry of the optical train of the system.

The conventional AF-system typically employs a reference beam that bounces off a so-called reference mirror or reflector that is used in addition to the measurement beams impinging on the target surface (see, for example, U.S. patent application Ser. No. 13/801,961). Due to the difference in spatial positioning and/or orientation between the reference mirror and the target surface to be measured, the reference beam is spatially displaced with respect to the measurement beam(s) in the proximity of the target surface, and the correlation of data acquired from the reference and measurement beams is inevitably reduced as a function of such displacement. Moreover, empirical experience showed that the identification of the air-turbulence-caused errors in the measurement of the target surface profile is notoriously difficult, as movement of air and/or air non-uniformity does not follow a normal distribution.

In stark contradistinction with an approach that, in attempt to compensate for the air-turbulence-caused errors, modifies the conventional AF-system to make the system sensitivities corresponding to the measurement beams and the reference beams substantially equal, embodiments of the present invention are directed to making these sensitivities as different as possible.

The following discussion refers to FIG. 1, which schematically illustrates the principle of operation of a fringe-projection sub-system 100 employing a diffraction grating 110 and used in an optical autofocus system. The purpose of the fringe-projection sub-system 100 is to project (image) a chosen irradiance pattern formed with the use of the grating 110 onto the target surface 112 of the substrate 114 (such as a wafer) and to re-image this pattern from the surface 112 onto the plane of the detector 120.

A simplified optical train of the fringe-projection sub-system includes a fringe-generating portion (or a source portion) 122 that contains a multi-wavelength source of light 124 forming in operation illuminating light 125; a grating 110; auxiliary optics such as lenses 126A, 126B; and a spatial filter 128. The optical elements of the portion 122 are configured, aggregately, to form the irradiance pattern (such as, for example, the pattern having a substantially sinusoidal cross-sectional profile) on the surface 114. The optical train also includes a receiving (or fringe-detecting portion) 134 optically coupled with the source portion 122 through the substrate 114 and structured to redirect light reflected by the substrate 114 to the detector 120.

The spatial filter 128 of the source portion 122 of the fringe-projection sub-system is positioned to block the zeroth diffraction order of light distribution formed, in reflection, by the grating 110 and let only the +1 and −1 orders pass towards the substrate 114. The projection of fringes onto the plane of the detector 120 represents, therefore, the interference of two off-axis plane waves (respectively corresponding to +1 and −1 orders of diffraction of light at the grating 110) on the plane of the detector and, at the same time, the imaging of the sinusoidal grating 110 onto the detector 120 with a portion of the sub-system 100.

In further reference to FIG. 1, because the grating 110 is imaged onto the surface 112 with a combination of optics forming an afocal optical relay, the fringe pattern 140 formed on the surface 112 at any wavelength generated by the source 124 has the same spatial frequency, while plane waves arriving at the surface 112 from the lens 126C at different wavelengths are incident onto the surface at respectively-corresponding different angles.

Figure 2:
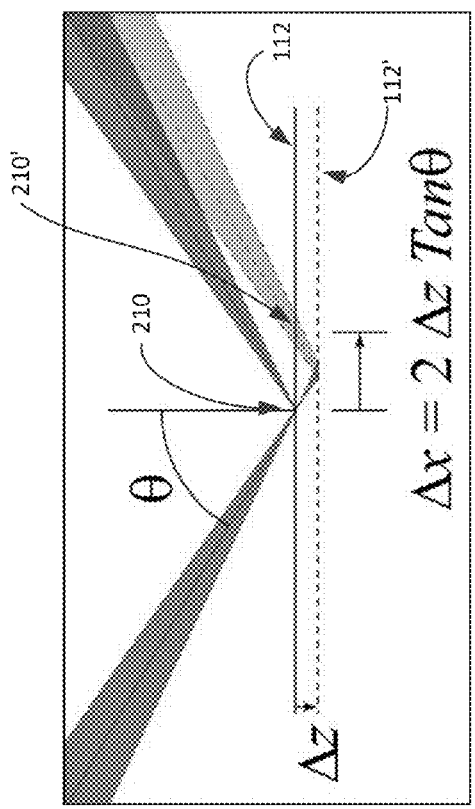
FIG. 2 is a diagram illustrating a shift of the fringe-pattern, formed by the fringe-projection subsystem, due to the deviation of a target surface from its nominal position.

The irradiance fringe(s) re-imaged onto the plane of the detector 120 with the use of reimaging optics 136A, 136B, 138 (and, optionally, additional optical elements, not shown) are used to determine the initial or nominal position of the surface 112 and changes in position of this surface with respect to the z-direction (defined as a direction along a normal to the surface 112, that typically coincides with a direction of wafer exposure during the operation of the lithographic exposure tool). Such determinations are made with the use of a specifically programmed data-processing electronic circuitry 150 that may include a computer processor. As schematically shown in FIG. 2, if and when the surface 112 moves along the z-axis by Δz and assumes a new position 112' (or, alternatively, when the profile or local height of the surface 112 changes, which produces the same results), a fringe 210 from the fringe pattern 140 is shifted laterally (from 210 to 210') in the same nominal plane by the distance Δx that is generally a function of Δz and the angle θ of incidence of light onto the surface 112. The output from the photodetector 120 (a position of which is defined by an optical conjugate of the nominal position of the surface 112) is used to determine the z-axis adjustments and corresponding focus adjustments required to keep the surface 112 at the optical focus of the system. In a conventionally-used fringe-projection AF system, a portion of light associated with the sub-system 100 can be delivered to a reference mirror (for example, one disposed substantially parallel to and in proximity with the substrate 114) to form a reference signal. Additional details of typical fringe projection AF system can be found in, for example, commonly assigned U.S. Patent Application Publications 2011/0071784 and 2012/0008150, the disclosure of each of which is incorporated herein by reference.

In further reference to FIG. 1, a typical fringe-projection sub-system 100 is structured such that light at any wavelength from the source 124 impinges on the same diffraction grating 110 at the same incident angle, and that the determination of the z-profile of the target surface 112 is carried out based on the measurements performed at at least two different wavelengths. Since the grating 110 is illuminated with light 125 at different wavelengths, and since the grating 110 is generally illuminated off-axis, the angle between the beams corresponding to +1 and −1 diffraction orders formed at the grating 110 is wavelength dependent, which causes a weak wavelength dependence of the measurement of the z-profile of the surface 112. For the sake of simplicity, such dependence may be neglected.

The spatial shift of a fringe pattern 140 (in one case—a sinusoidal distribution of irradiance) along the surface 112 (as compared to the position of a fringe pattern on a nominally located surface 112) and a corresponding shift of the image of this fringe pattern on the plane of the detector 120 are caused not only by the change of profile (or movement) of the surface 112 along the z-axis, but also by the change in index of refraction of the medium (such as air) through which light forming the fringe pattern arrives at the surface 112. (In practice, most of the optical elements of the receiving portion 134 of the system can be contained in a tube or barrel with a stable environment, thereby reducing practical implications of any residual errors attributed to air-movement in the portion 134 and making errors caused by the air non-uniformity in the wafer space dominate.)

Figure 3:
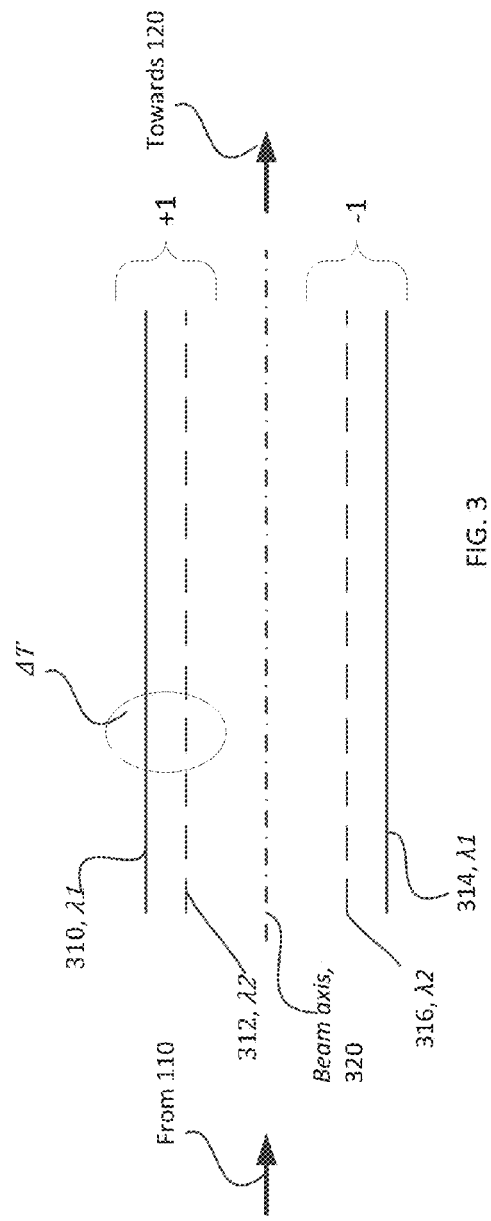
FIG. 3 is a diagram illustrating a concept of air-turbulence-caused difference in optical lengths corresponding to paths of propagation, through the fringe-projection sub-system of the autofocus-adjusting system, of measurement beam corresponding to different orders of diffraction formed by the grating of the sub-system.

To this end, FIG. 3 provides a simplified illustration of changes in an optical path of light traversing the fringe-projection sub-system, which changes are associated with air flow that is practically always present during the operation of the AF system of the invention. The typical air turbulences evolve slowly with time, and temporal frequencies associated with the related change of the optical path length(s) are typically on the order of about several tens of Hz or less (for example, at about 20 Hz or so). In FIG. 3, light portions at wavelengths $\lambda_1$, $\lambda_2$ in +1 and −1 diffraction orders are shown, respectively, with lines 310, 312, 314, and 316 with respect to the local optical axis 320 of the overall light beam. When, due to some change in local conditions along the optical path associated with the fringe-projection system such as air turbulence or other air-turbulence effects (ATE) and related experimental errors, the air temperature, for example, changes by ΔT, the corresponding optical path difference ($OPD_{ATE}$) for the light portions corresponding to the +1 and −1 diffractive orders causes the lateral shift of fringes in the plane of the detector 120. Such ATE-dependent shift is normally erroneously interpreted by the data-processing electronic circuitry 150 of the AF system as a change in vertical (z-axis) profile or z-axis repositioning of the surface 112, thereby contributing to the error in determination of the required optical focus correction.

Generally, any portion of the path of light through the fringe-projection system where there is an optical path difference between the +1 and −1 orders arriving from the diffraction grating 110, may in practice cause such errors in practice. It should be noted that the $OPD_{ATE}$-based error is not reduced to zero if and when the thermal distribution of air in the fringe-projection system does not change in time. When the distribution of temperature along the optical path of light in the fringe-projection system is fixed in time, such distribution creates an offset (bias, or "ATE fingerprint" of the fringe-projection system) in phase, which may be spatially non-uniform and vary along x- and/or y-axis. This phase-bias that is added to the phase change of light contributed by profile/position of the wafer. The disclosed methodology provides for measurement of such bias or "fingerprint" phase, which is then subtracted from the measurement data to correct the measurement data for the presence of the ATE-related error.

It would be appreciated by a person of skill in the art that such ATE-dependent phase shift $\varphi_{ATE}$ and the corresponding contribution to the lateral shift of the fringe pattern caused by the ATE, the value of which can be determined based on fringe-dependent irradiance data acquired from the detector 120, is approximately reciprocally dependent on wavelength. In comparison, the phase shift $\varphi_z$ and the corresponding contribution to the lateral shift of the fringe pattern caused by the change in z-profile of the measured surface 112 depend on the angle θ of incidence of light at wavelength λ onto the surface 112, and the difference Δθ between the angular directions of propagation of the +1 and −1 orders of diffraction from the grating 110, Δθ=θ$_{+1}$−θ$_{−1}$. (It follows from the grating equation that Δθ can be considered to vary approximately linearly with wavelength.) The overall, aggregate estimate of the phase z̃·A derived from the measurements of the z-profile of the surface 112 with the AF system that employs a fringe-projection sub-system can be expressed, therefore, as $$\tilde{z} \cdot A = \varphi_z + \varphi_{ATE} = \varphi_z + b \cdot OPE_{ATE} \quad (1a),$$

or, in terms of geometrical distances, $$\tilde{z} = z(x, y, \lambda) + \text{(error term due to APE)} \quad (1b)$$

where other error terms are neglected; where A [radian/μm] is the coefficient of sensitivity of an AF system measurement response to the changes in the actual topographic profile z=z(x,y) of the surface 112; and where b is a coefficient of sensitivity of the measurement to ATE, which is expressed in radians of a fringe-phase per micrometer of the $OPD_{ATE}$ and which, therefore, is wavelength dependent.

As the profile z(x,y) of the surface 112 is measured, in practice, with the AF system that employs the fringe-projection system operating at at least two wavelengths $\lambda_1$, $\lambda_2$, an embodiment of the system of the invention normally generates at least two respectively-corresponding empirical estimates $\tilde{z}_1$, $\tilde{z}_2$ of the changes in the surface 112 profile corresponding to the measurements at these multiple wavelengths:

$$\tilde{z}_1 A_1 = \varphi_{z1} + b_1 OPD_{ATE} \quad (2a), \text{ and}$$

$$\tilde{z}_2 A_2 = \varphi_{z2} + b_2 OPD_{ATE} \quad (2b),$$

where $\varphi_{zi} = A_i \cdot z$ (2c)

and the empirically measured phase terms $\tilde{z}_i A_i = (\lambda_i, \theta_i, T_i)$ are in radians.

The idea of the invention stems from the realization that when a fringe-projection system is judiciously structured to ensure that (i) pair of the beams of light used for the measurement of the z-profile of the target surface 112—for example, the beams of light at $\lambda_1$ or $\lambda_2$—are employed as reference beams (in which case the fringe-projection system does not require a reference mirror); and that (ii) the sensitivity coefficients $A_i$, as well as the coefficients $b_i$, are different for the measurements performed at different wavelengths and angles of incidence, the profile of the target surface can be derived to be sufficiently free from the ATE-related errors. As a welcome corollary of such approach, the AF system is now simplified and made devoid of a reference mirror.

As a result of this realization, the fringe-projection sub-system of the AF system of an embodiment of the present invention is devised such that the two pairs of beams of light, used for the measurements of the target surface profile at $\lambda_1$, $\lambda_2$, produce two corresponding sets of irradiance data respectively representing the two types of unknown phase shifts ($\varphi_{zi}$ and $\varphi_{ATEi}$) that are coupled through a system of two equations and, therefore, can be directly determined based on the results of the measurements only.

An embodiment of the method for deriving the target surface profile that is substantially free from the ATE-related errors employs an algorithm directed at solving the system of equations (2a), (2b), (2c) with respect to the x-and-y dependent profile figure z=z(x,y). Solved for the product of $b_1 OPE_{ATE}$, the above equations result in $$b_1 OPD_{ATE} = b_1 OPD_{ATE}(x, y, t) = \frac{\frac{A_1}{A_2}(\tilde{z}_2 A_2) - (\tilde{z}_1 A_1)}{\frac{A_1 b_2}{A_2 b_1} - 1} \quad (3)$$

Thereafter, the spatial function z defining the topography of the target surface 112 can be determined based on the measurement data representing the results of the measurement at $\lambda_1$ as, for example $$z = \frac{\varphi_{z1}}{A_1} = \frac{1}{A_1}[\tilde{z}_1 A_1 - b_1 OPE_{ATE}] \quad (4)$$

or, alternatively and in a fashion similar to that of Eq. (4), based on the measurement data representing the results of the measurement at $\lambda_1$.

Determination of Empirical Constants.

The values of $A_1$, $A_2$ are pre-defined by the system design as follows. Although the fringe pattern is imaged onto the substrate 114 with some magnification coefficient, for the purposes of illustration it can be assumed that the imaging is performed with a magnification coefficient of 1 (such that angles at the grating 110 are the same as corresponding angles at the substrate 114). The phase terms representing the fringe shift caused by the changes of topography of the surface 112 are expressed as $$\varphi_{zi} = \frac{8\pi \cdot \sin\theta_i \cdot \sin\Delta\theta_i}{\lambda_i} z, \quad (5)$$

where $\theta_i$ is the average angle of incidence of light at $\lambda_i$ in +1 and −1 orders of diffraction onto the surface 112 and Δθ is the angular deviation between the +1 and −1 orders of diffraction. Both angles, $\theta_i$ and Δθ are calculated based at least in part on the center wavelength λ, the pitch T of the grating 110, and the angle of incidence of light from the source 124 onto the grating 110. In a specific case corresponding to the embodiment 100 of FIG. 1, where the spatial filter 128 is designed to block the zeroth order of diffraction, the pitch of the fringe pattern 140 is half that of the grating (i.e., equal to T/2). Accordingly, $$A_i = \frac{8\pi \cdot \sin\theta_i \cdot \sin\Delta\theta_i}{\lambda_i}. \quad (6)$$

As understood by a person of skill in the art, the coefficients $b_i$ are but the coefficients of conversion between the optical path difference and phase:

$$b_i = 2\pi/\lambda_i \quad (7)$$

and, in Eq. (3), $b_2/b_1 = \lambda_1/\lambda_2$.

Substituting the above-defined terms in Eq. (4) provides that the topography of the target surface 112 can be expressed as a function of the two empirically measured phase terms $\tilde{z}_1 A_1$, $\tilde{z}_2 A_2$, two system-dependent constants $A_1, A_2$, and the a priori known wavelengths chosen for operation of the fringe-projection system of the embodiment of the invention:

$$z = \frac{1}{A_1}\left[\tilde{z}_1 A_1 - b_1 \frac{\frac{A_1}{A_2}(\tilde{z}_2 A_2) - (\tilde{z}_1 A_1)}{\frac{A_1 \lambda_2}{A_2 \lambda_1} - 1}\right] \quad (8)$$

It is appreciated that light sources with broadband spectrum can be used, in which case the values of wavelengths $\lambda_1$, $\lambda_2$ are determined as, for example, as spectrally weighted, average values. While in practice the measurement of the phase terms may have a noise component to them (as may, for example, the estimated of $OPD_{ATE}$ term) based on the system parameters $\lambda$, T, $\theta_i$, the amplification or reduction of such noise level can be generally addressed on the level of fringe-projection system design.

It is worth noting that, when averaged over space (x,y) and/or time (t), a more accurate estimated of the $OPD_{ATE}$ can be obtained. Averaging over space is useful because the $OPD_{ATE}$ does not vary significantly on a small spatial scale. For example, spatial variations of a given parameter across a span of a few millimeters (for example, 3 to 5 millimeters) can be sufficiently accurately modeled with the use of a second-order polynomial, with the spatial sampling on the order of 0.05 mm to 1 mm. Averaging over time may be particularly efficient because in practice the time-sampling of the ATE-dependent phase term can be effectuated at a frame-rate of about 1 to 2 kHz or so while the ATE-caused phase itself changes at a rate of several tens of Hz. Addition of complementary measurements at additional wavelengths can further improve the estimation process based on the use of linear algebra techniques such as, for example, least square approach.

Representative Target Substrate Support Stage and High-Speed Scanning.

Figure 4:
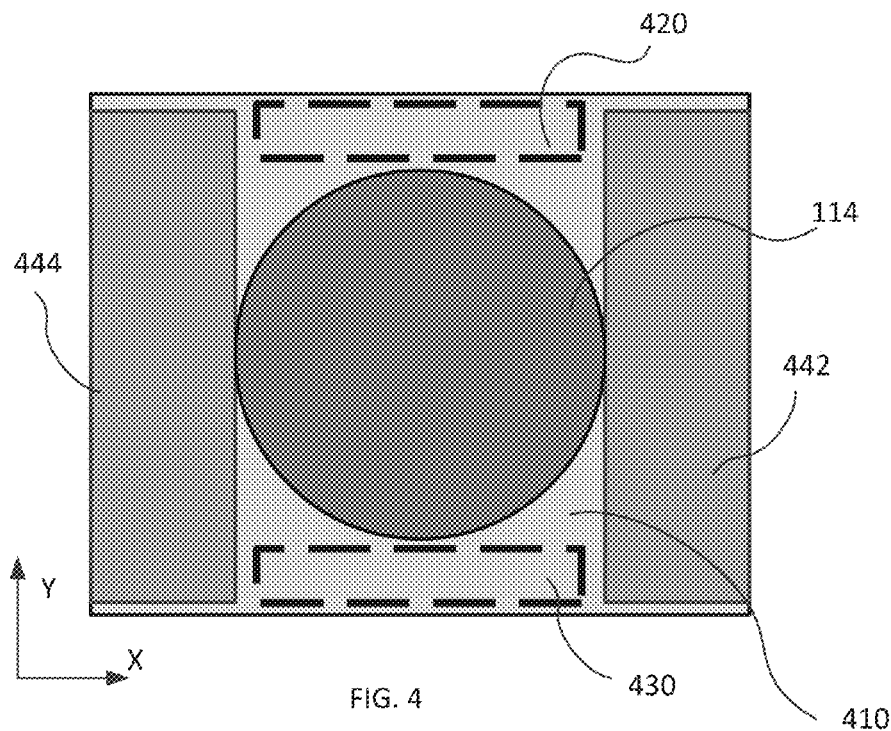
FIG. 4 is a top view of an embodiment of the sample-holding portion of the autofocus-adjusting system of the invention structured to empirically enable an embodiment of the invention.

In reference to FIG. 4, providing a top view of the target substrate 114 positioned on a supporting stage 410 as part of the fringe-projecting subsystem, the supporting stage 410 includes two regions 420, 430 adjacent to and on the opposite sides of the substrate 114 along the direction of scanning of the substrate 114 (y-axis as shown). Each of the regions 420, 430 (outlined schematically with dashed lines) is reflective at $\lambda_1$, $\lambda_2$ and sufficiently flat (for example, the entire surface flatness is better than a few tens of microns peak-to-valley such that it is easily captured within the dynamic range of the AF system), contains no surface patterns and/or layered optical structures such as coatings (and, therefore, introduces no Goos-Hanchen (GH) shift in the beam of light incident onto such regions), and has approximately the same z-height as the top surface 112 of the substrate 114. The surface profile of the regions 420, 430 is judiciously chosen such that interaction of incident light with the regions 420, 430 is substantially independent from the wavelength and polarization of the incident light. Elements 442, 444 signify auxiliary elements of the system that may be disposed in the proximity of the substrate 114.

Figure 5C:
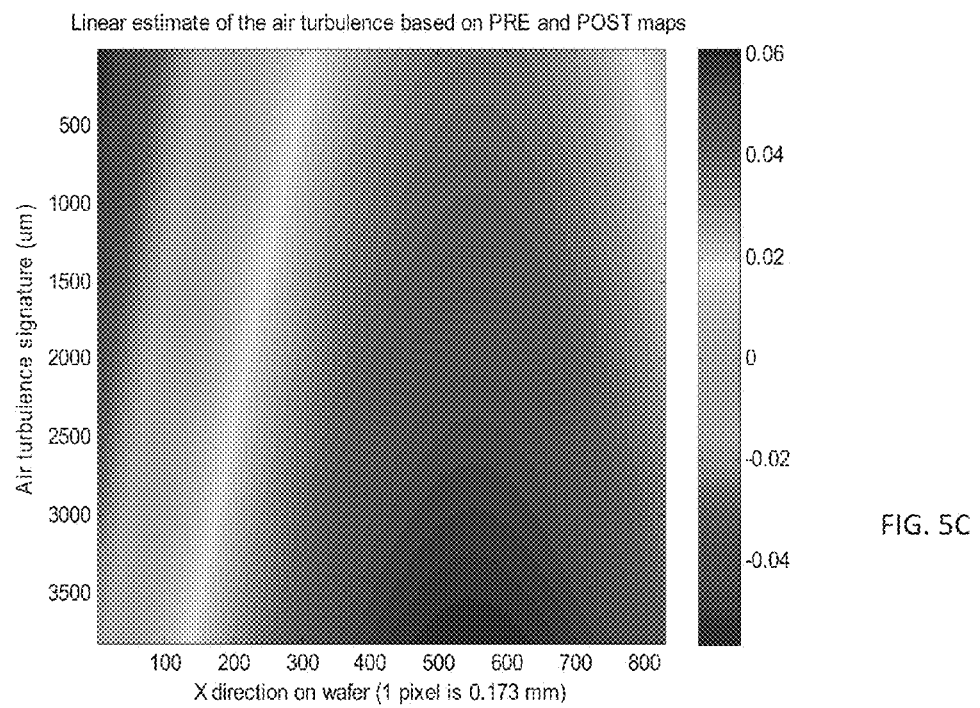
FIGS. 5A, 5B, and 5C are plots illustrating an implementation of a method of the invention used to correct the results of the measurement of the target surface profile by the empirically-determined value representing an air-turbulence-caused error.
Figure 5A:
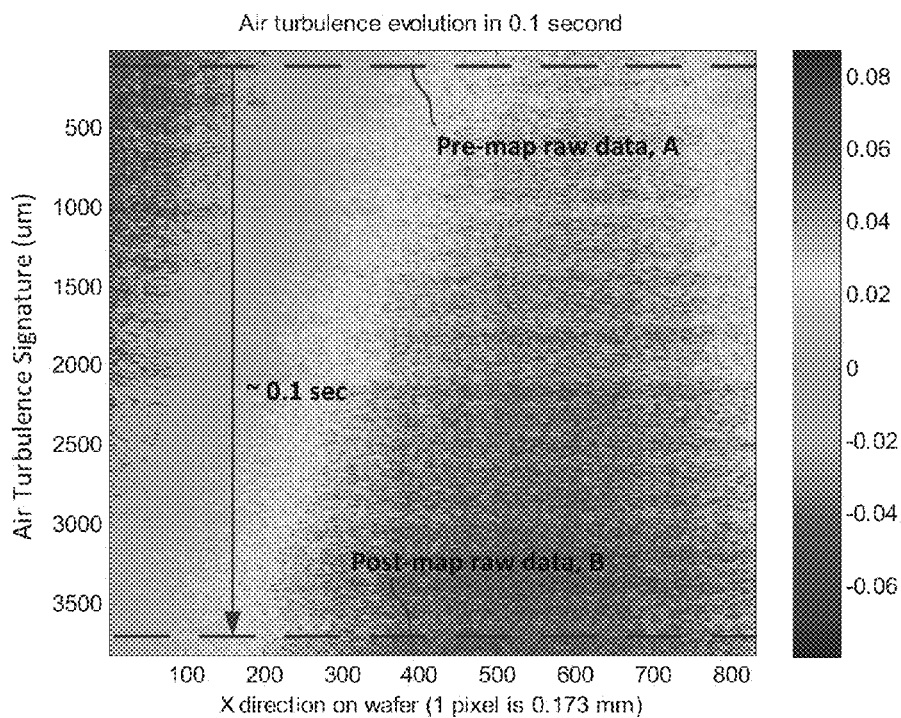
Figure 5B:
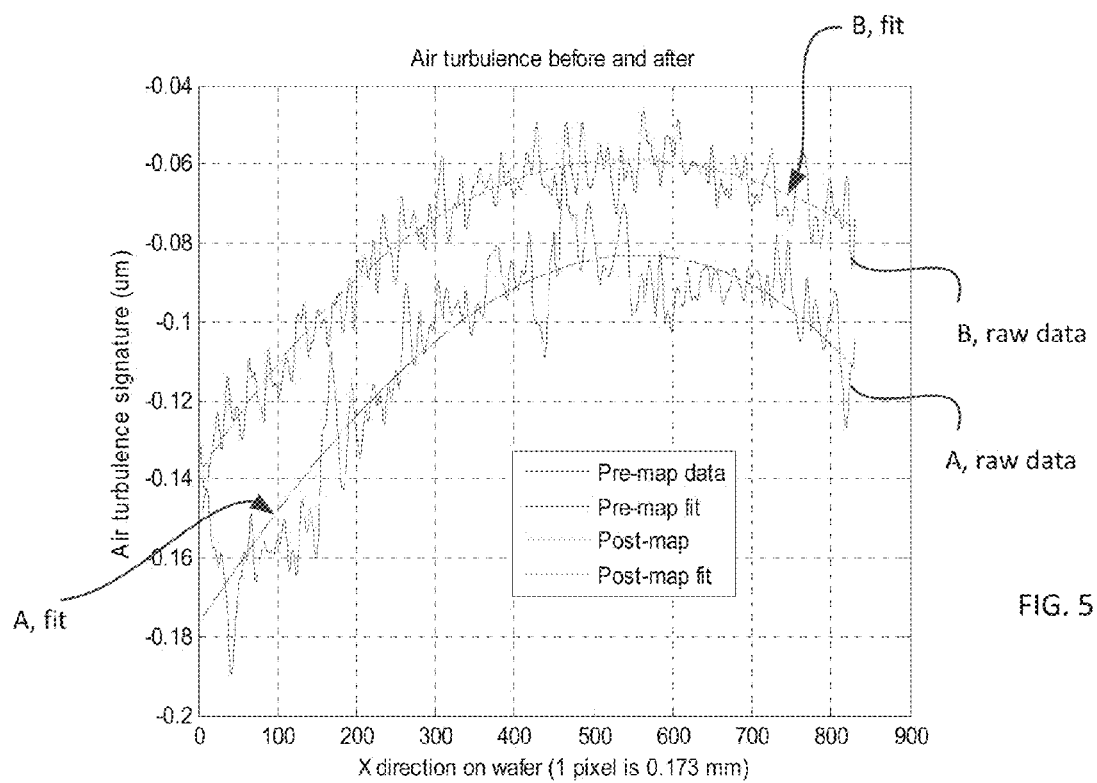

In the simplest case, the supporting stage 410 with the substrate 114 on it is scanned along the y-direction starting at the region 420 (referred to as pre-mapping), through the region occupied by the substrate 114 (mapping), and towards to and finishing with the region 430 (post-mapping) at speeds that allow the scanning process to be completed in a fraction of time on the scale of which the ATE are pronounced. In one example, the scan is completed in under 0.25 second or, in a specific case, in about 0.1 seconds. FIG. 5A provides an areal map of the aggregate z-profile of the measured surface determined based on the measurement data. During such scan, the $OPD_{ATE}$ data and the corresponding error in estimation of the surface profile of the substrate 114 (referred to as the AT-signature) are measured across the region 420 (along the line A of FIG. 5A) and across the region 430 (along the line B of FIG. 5A) and plotted in FIG. 5B as "A, raw data" and "B, raw data" together with the corresponding polynomial fits "A, fit" and "B, fit". Provided the relative slow rate of change of the air turbulence, the air turbulence effects can be reliably assumed to vary linearly across the measured field between the values corresponding to the curves "A, fit" and "B, fit" of FIG. 5B. So linearly approximated, the $OPD_{ATE}(x,y)$ is shown in the form of a 2D map in FIG. 5C. By subtracting the 2D map of FIG. C from that of FIG. 5A and addressing auxiliary sources of noise in data, the estimation of the 2D z-profile of the target surface 112 of the substrate 114 is made that is substantially free from the contribution cause by the ATE-errors.

Mismatch of Optical Paths of Different Measuring Beams and Other Causes of Measurement Noise.

Figure 6:
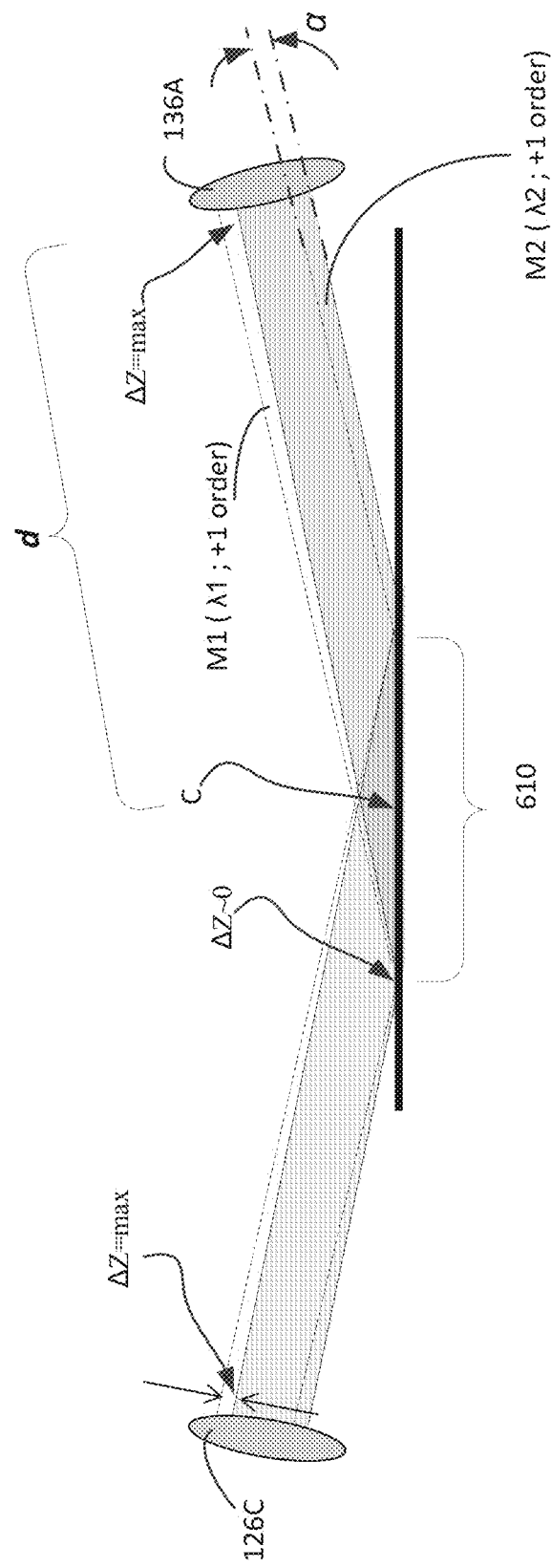
FIG. 6 illustrates schematically the spatial divergence of +1 orders of diffraction of measurement beams propagating through the fringe-projection sub-system.

Referring again to FIG. 1, it is appreciated that in practice, as the target substrate 114 of FIG. 1 is imaged onto the detector 120 with minimal (if any) chromatic aberrations, the measurement beams at different wavelengths $\lambda_1$, $\lambda_2$ overlap at the plane of the detector 120, and in the proximity of the target substrate, and at the target substrate. However, these beams do not follow exactly the same optical path upon propagation through the fringe projection sub-system 100 between the relaying optics 126C and 136A. Accordingly, the measurement beams follow slightly different optical paths across the pocket of air non-uniformity or turbulence shown as $\Delta T$ in FIG. 3. The diagram of FIG. 6 illustrates this situation for the +1 orders of diffraction only (for the simplicity of illustration the −1 order of diffraction has been omitted), showing the minimum (if any) separation (marked as $\Delta Z \sim 0$) between the measurement beams $M_1$ ($\lambda_1$, T, $\theta_1$) and $M_2$ ($\lambda_2$, T, $\theta_2$) within the region of interest defined by the measurement span 610 at the substrate 114, and substantial spatial separation (along the z-axis as shown and marked as $\Delta Z \sim max$) between these beams near the relaying optics.

The quantification of the value of $\Delta Z$ is a function of the measurement span 610, distance d from the center C of the measurement span 610 to the lens 136A, and the angle $\alpha$ between the directions of propagation of the beams $M_1$ and $M_2$ at the lens 136A as $\Delta Z \sim (d/2)*\tan(\alpha)$. A person of skill in the art will appreciate, therefore, that for a given threshold level of ATE-caused error in the target surface profile measurement, the higher the spatial correlation of the regions or cells with air-turbulence that measurement beams traverse, the higher the divergence between the measurement beams $M_1$, $M_2$ (and the larger the separation $\Delta Z$) that an embodiment of the fringe-projection sub-system can afford. The fringe-projection AF system of an embodiment of the invention delivers practical results while tolerating a certain level of errors the range of which is defined, at least in part, by the space of parameters of the fringe-projection sub-system. Some of the examples are presented below. It is worth mentioning that, while the pitch of the grating 110 of the fringe-projection system can be used as a measurement-error varying parameter, in practice any change in the grating pitch is associated with the increased complexity of the optical portion of the AF-system as it changes the mutual angular positioning of the AF-system components and is subject to strict practical spatial constraints.

Example 1

One way of quantifying the operational space of an embodiment of the invention is to define a dimensionless figure of merit or error factor EF representing, for example, a ratio of an estimate of the ATE-caused contribution to the profile of the target surface to the overall figure representing the profile of the target surface determined during the measurement. EF=1 means that any random errors in the measurement such as errors due to shot noise, for example, are not amplified, Eq. (8); a value of EF>1 means these random errors are amplified.

Figure 7A:
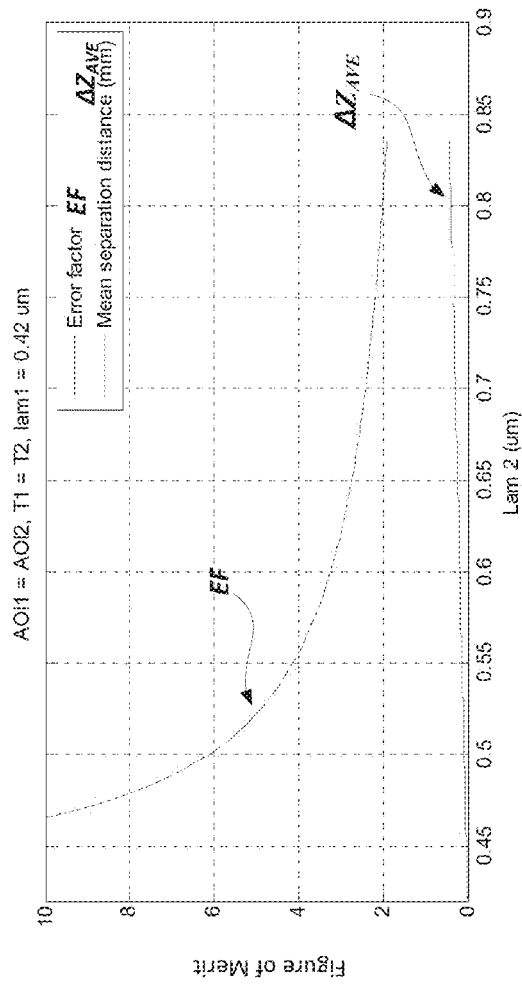
FIGS. 7A, 7B, and 7C are plots illustrating general dependencies and trade-offs of measurement errors as functions of identified parameters of the autofocus-adjusting system.

A fringe-projection subsystem employs a grating 110 with a pitch T=678 microns and is structured such that the averaged (over the +1 and −1 orders of diffraction) angles of incidence of the measurement beams at $\lambda_1$, $\lambda_2$ onto the surface 112 of the substrate 114 are AOI1=AOI2=$\theta_1$=$\theta_2$=86°. For $\lambda_1$=0.42 μm and variable $\lambda_2$, the plots in FIG. 7A illustrate dependencies of the EF and the separation distance $\Delta Z_{ave}$ (representing $\Delta Z$ averaged over d=100 mm). For the measurement utilizing $\lambda_2$=0.5 μm, for example, the EF is about 6 nm/nm, while $\Delta Z_{ave}$ is about 0.08 mm. In comparison, for the measurement utilizing $\lambda_2$=0.8 μm, EF is about 2 nm/nm, while $\Delta Z_{ave}$ is about 0.4 mm. It is realized, therefore, that there is a practical trade-off between the degree by which the ATE-caused error in the surface-profile measurement can be reduced by choosing the operational wavelengths of the system of the invention and a mismatch of optical paths of the light beams at different wavelengths propagating through the fringe-projection subsystem.

Example 2

Figure 7B:
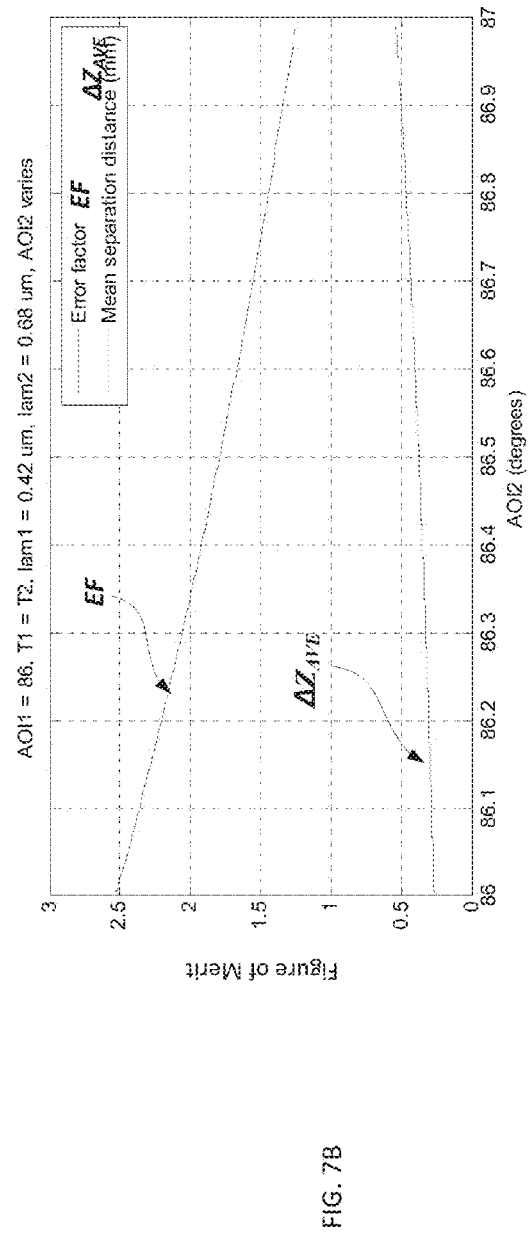

The plots of FIG. 7B schematically illustrate the influence of the variation of the angle of incidence of the measurement beam (at $\lambda_2$) on the target surface 112. Specifically, the plots are showing the dependence of the EF and $\Delta Z_{ave}$ on AOI2=$\theta_2$ for the fringe-projection sub-system of Example 1 in which the wavelength $\lambda_2$ is fixed at 0.68 micron. Generally, increasing the angle of incidence leads to reduction of the error factor.

Example 3

Figure 7C:
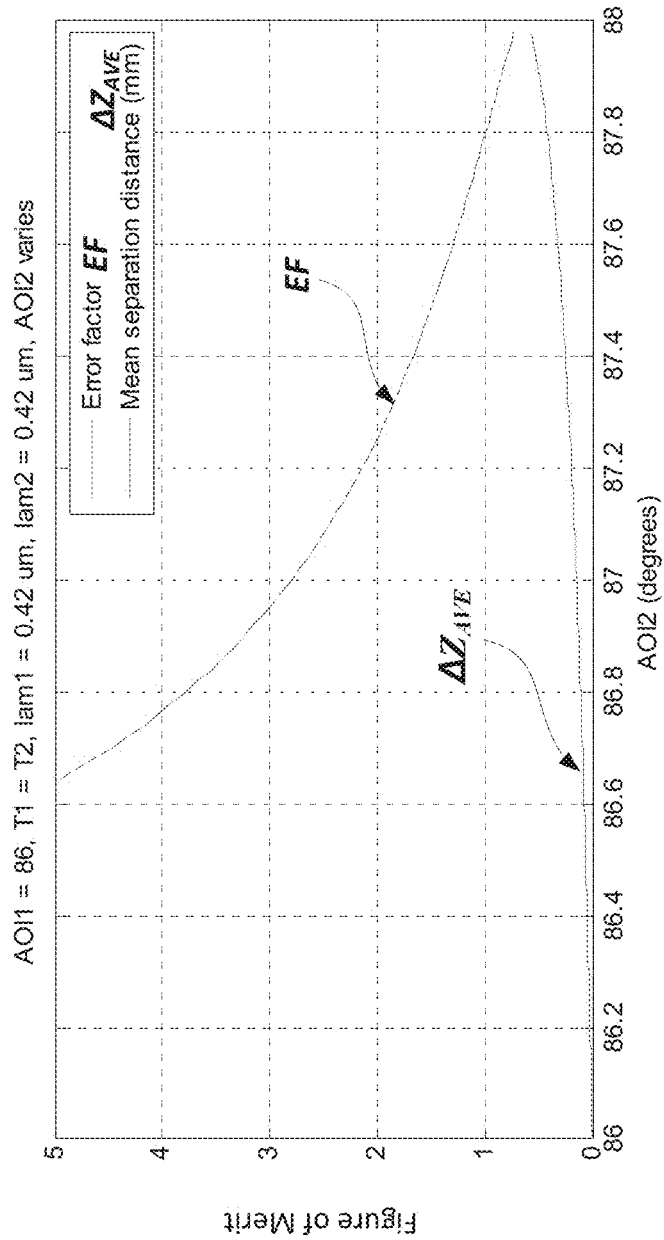

Another example, the assessment of errors in which is shown in FIG. 7C, illustrates the measurement set-up according to that of Example 2, in which both of the measurement wavelengths are set to the same value $\lambda_1$=$\lambda_2$=0.42 μm. Under these conditions, the EF of 2 nm/nm can be achieved at AOI2=$\theta_2$=87.25 degrees with $\Delta Z_{ave}$ of about 0.2 mm. In general, however, the choice of spectrally-close measurement wavelengths is not necessarily preferred as the rate of change of the EF and/or $\Delta Z_{ave}$ with respect to the change in the AOI2=$\theta_2$ is higher than that for the measurement utilizing the wavelengths with large spectral separation.

The error factor can be practically reduced by, for example, noticing that the ATE-effects are developing at the time scale that is slow as compared to the rate of measurement sampling and averaging the results of multiple measurements. For example, if the EF=2, the averaging can be made over 4 measurement frames, as a result of which the EF value is reduced by sqrt(4)=2 to EF=1. In addition or alternatively, the constraints imposed on numerical aperture (NA) of the imaging optics of the AF system should be taken into account. (Typical value of numerical aperture of the AF system is about NA~0.02 at the angle of incidence, of light onto the target surface 112, of about 86 degrees.) Additional causes of practical errors include the errors in determination of $A_1$, $A_2$, $b_1$, and $b_2$ of Eqs. (6, 7). The errors in determination of these empirical parameters can be sufficiently reduced by accurate characterization of the wavelengths used for the measurements and the spectral filtering done by the optical system, which affects the accuracy of the determination of $b_i$. The values of $A_i$ can be sufficiently accurately calibrated based on z-position monitoring of the AF-system (which, in a typical lithography system is at the level of sub-nm).

Example of Photolithographic (Exposure) Apparatus.

FIG. 8 provides a schematic view illustrating a photolithography apparatus 800 (referred to interchangeably as scanner, imaging system, exposure apparatus, exposure tool, etc.) utilizing an embodiment of the fringe-projection system of the present invention. The wafer positioning unit 852 includes a wafer stage 851, the following stage 803A and an actuator 806. The wafer stage 851 comprises a wafer chuck that holds a wafer W and an interferometer mirror IM. The exposure apparatus 800 can also include an encoder to measure stage position (not shown for simplicity of illustration). The base 801 may be supported by a plurality of isolators 854 (or a reaction frame), a least one of which may include a gimbal air bearing. The following stage base 803A is supported by a wafer stage frame (reaction frame) 866. The additional actuator 806 is supported on the ground G through a reaction frame. The wafer positioning stage 852 is structured so that it can move the wafer stage 851 in multiple (e.g., three to six) degrees of freedom under precision control by a drive control unit and system controller (not shown), and position and orient the wafer W as desired relative to the projection optics 846. In the specific embodiment 800, the wafer stage 851 may have six degrees of freedom and utilizes forces vectored in the Z direction and generated by the x-motor and the y-motor of the wafer positioning stage 852 to control a leveling of the wafer W. However, a wafer table having three degrees of freedom (such as for example Z, $\theta_X$, $\theta_Y$) or six degrees of freedom can be attached to the wafer stage 851 to control the leveling of the wafer. The wafer table may includes the wafer chuck, at least three voice coil motors (not shown), and a bearing system. The wafer table may be levitated in the vertical plane by the voice coil motors and supported on the wafer stage 851 by the bearing system so that the wafer table can move relative to the wafer stage 851.

The reaction force generated by the wafer stage 851 motion in the X direction can be canceled by motion of the base 801 and the additional actuator 806. Further, the reaction force generated by the wafer stage motion in the Y direction can be canceled by the motion of the following stage base 1033A.

An illumination system 842 is supported by a frame 872. The illumination system 842 projects radiant energy (e.g., light) through a mask pattern on a reticle R, which is supported by and scanned using a reticle stage. Alternatively, in the case of systems using extreme ultraviolet (EUV) radiation, radiant energy is reflected by the reticle R. The reticle stage may have a reticle coarse stage for coarse motion and a reticle fine stage for fine motion. In this case, the reticle coarse stage corresponds to the translation stage table 810, with one degree of freedom. The reaction force generated by the motion of the reticle stage can be mechanically released to the ground through a reticle stage frame and the isolator 854 (in one example—in accordance with the structures described in JP Hei 8-330224 and U.S. Pat. No. 5,874,820, the entire contents of each of which are incorporated by reference herein). The light is focused by a projection optical system (lens assembly) 846 supported on a projection optics frame and released to the ground through isolator 854. The lens assembly 846 may include transmitting glass elements (refractive), reflecting mirrors (reflective) or a combination of the two (catadioptric) such as discussed, for example, in co-assigned patent application 61/907,747 and U.S. Pat. No. 8,705,170, the disclosure of each of which is incorporated herein by reference.

An interferometric system 856 (in one implementation—a fringe-projection AF system according to an embodiment of the present invention) is supported on the projection optics frame and configured to detect the position of the wafer stage 851 and generate output data representing the position of the wafer stage 851 to the system controller 862. A second interferometer 858 can be supported on the projection optics frame and configured t0 detect the position of the reticle stage and outputs the information of the position to the system controller. The system controller controls a drive control unit to position the reticle R at a desired position and orientation relative to the wafer W or the projection optics 846.

There are numerous different types of photolithographic devices which can benefit from employing an embodiment of the present invention. For example, the apparatus 800 may comprise an exposure apparatus that can be used as a scanning type photolithography system, which exposes the pattern from reticle R onto wafer W with reticle R and wafer W moving synchronously. In a scanning type lithographic device, reticle R is moved perpendicular to an optical axis of projection optics 846 by reticle stage and wafer W is moved perpendicular to an optical axis of projection optics 846 by wafer positioning stage 152. Scanning of reticle R and wafer W occurs while reticle R and wafer W are moving synchronously but in opposite directions along mutually parallel axes parallel to the x-axis.

Alternatively, the exposure apparatus 800 can be a step-and-repeat type photolithography system that exposes reticle R, while reticle R and wafer W are stationary. In the step and repeat process, wafer W is in a fixed position relative to reticle R and projection optics 846 during the exposure of an individual field. Subsequently, between consecutive exposure steps, wafer W is consecutively moved by wafer positioning stage 852 perpendicular to the optical axis of projection optics 846 so that the next field of semiconductor wafer W is brought into position relative to projection optics 846 and reticle R for exposure. Following this process, the images on reticle R are sequentially exposed onto the fields of wafer W so that the next field of semiconductor wafer W is brought into position relative to projection optics 846 and reticle R.

However, the use of the exposure apparatus 800 schematically presented in FIG. 8 is generally not limited to a photolithography system for semiconductor manufacturing. The apparatus 800 (an exposure apparatus), for example can be used as an LCD photolithography system that exposes a liquid crystal display device pattern onto a rectangular glass plate or a photolithography system for manufacturing a thin film magnetic head.

In the illumination system 842, the illumination source can be a source configured to generate light at g-line (436 nm), i-line (365 nm), or to include a KrF excimer laser (248 nm), ArF excimer laser (193 nm), $F_2$ laser (157 nm) or to generate radiation in EUV (for example, at about 13.5 nm).

With respect to projection optics 846, when far ultra-violet rays such as the excimer laser is used, glass materials such as quartz and fluorite that transmit far ultra-violet rays are preferably used. When the $F_2$ type laser, projection optics 846 should preferably be either catadioptric or refractive (a reticle should also preferably be a reflective type). When extreme ultra-violet (EUV) rays or x-rays are used the projection optics 46 should preferably be fully reflective, as should the reticle.

With an exposure device that employs vacuum ultra-violet radiation (VUV) of wavelength 200 nm or shorter, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japanese Patent Application Disclosure No. 10-20195 and its counterpart U.S. Pat. No. 5,835,275. In these cases, the reflecting optical device can be a catadioptric optical system incorporating a beam splitter and concave mirror. Japanese Patent Application Disclosure No. 8-334695 published in the Official Gazette for Laid-Open Patent Applications and its counterpart U.S. Pat. No. 5,689,377 as well as Japanese Patent Application Disclosure No. 10-3039 and its counterpart U.S. Pat. No. 5,892,117 also use a reflecting-refracting type of optical system incorporating a concave minor, etc., but without a beam splitter, and can also be employed with this invention. The disclosure of each of the above-mentioned U.S. patents, as well as the Japanese patent applications published in the Office Gazette for Laid-Open Patent Applications is incorporated herein by reference.

Further, in photolithography systems, when linear motors that differ from the motors shown in the above embodiments (see U.S. Pat. No. 5,623,853 or U.S. Pat. No. 5,528,118 for example) are used in one of a wafer stage or a reticle stage, the linear motors can be either an air levitation type employing air bearings or a magnetic levitation type using Lorentz force or reactance force. Additionally, the stage could move along a guide, or it could be a guideless type stage that uses no guide. The disclosure of each of U.S. Pat. Nos. 5,623,853 and 5,528,118 is incorporated herein by reference.

Alternatively, one of the stages could be driven by a planar motor, which drives the stage by electromagnetic force generated by a magnet unit having two-dimensionally arranged magnets and an armature coil unit having two-dimensionally arranged coils in facing positions. With this type of driving system, either one of the magnet unit and the armature coil unit is connected to the stage, and the other unit is mounted on the moving plane side of the stage.

Movement of the stages as described above generates reaction forces that can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. The disclosure of each of U.S. Pat. Nos. 5,528,118 and 5,874,820 and Japanese Patent Application Disclosure No. 8-330224 is incorporated herein by reference.

Example of Environment of an Embodiment of the System

The present invention may be embodied in different forms such as a system, method, or computer program product. For example, those skilled in the art should readily appreciate that functions, operations, decisions, etc. of all or a portion of a method of the invention may be implemented as computer program instructions, software, hardware, firmware or combinations thereof. Those skilled in the art should also readily appreciate that instructions or programs defining the functions of the present invention may be delivered to a processor in many forms, including, but not limited to, information permanently stored on non-writable storage media (e.g. read-only memory devices within a computer, such as ROM, or devices readable by a computer I/O attachment, such as CD-ROM or DVD disks), information alterably stored on writable storage media (for example, floppy disks, removable flash memory and hard drives) or information conveyed to a computer through communication media, including wired or wireless computer networks.

In addition, while the invention may be embodied in software, the functions necessary to implement the invention may optionally or alternatively be embodied in part or in whole using firmware and/or hardware components (such as combinatorial logic, Application Specific Integrated Circuits or ASICs, Field-Programmable Gate Arrays or FPGAs, or other hardware or some combination of hardware, software and/or firmware components), and may include an specific electronic circuitry or a processor controlled by instructions stored in a tangible, non-transient memory medium. The computer-usable or computer-readable medium may be, for example, an electronic, magnetic, optical, electromagnetic, infrared, or semiconductor system, apparatus, device, or propagation medium. For example, computer-usable or computer-readable medium may include a tangible non-transitory storage medium, such as, without limitation, a random access memory (RAM), a read-only memory (ROM), an erasable programmable read-only memory (EPROM or Flash memory), a compact disc read-only memory (CDROM), and/or an optical storage memory medium, or any other memory, or combination thereof, suitable for storing control software or other instructions and data. The computer-usable or computer-readable medium may comprise and/or be complemented with an apparatus that contains, stores, communicates, propagates, or transports program code for use by or in connection with the instruction execution system, apparatus, or device. The computer program product may comprise program code stored in a computer readable medium that, when executed on a computing device, causes the computing device to perform and/or govern one or more of the processes described herein. The computer program product can be written in any conventional programming language (such as, in one example, C++) or the like.

Figure 9:
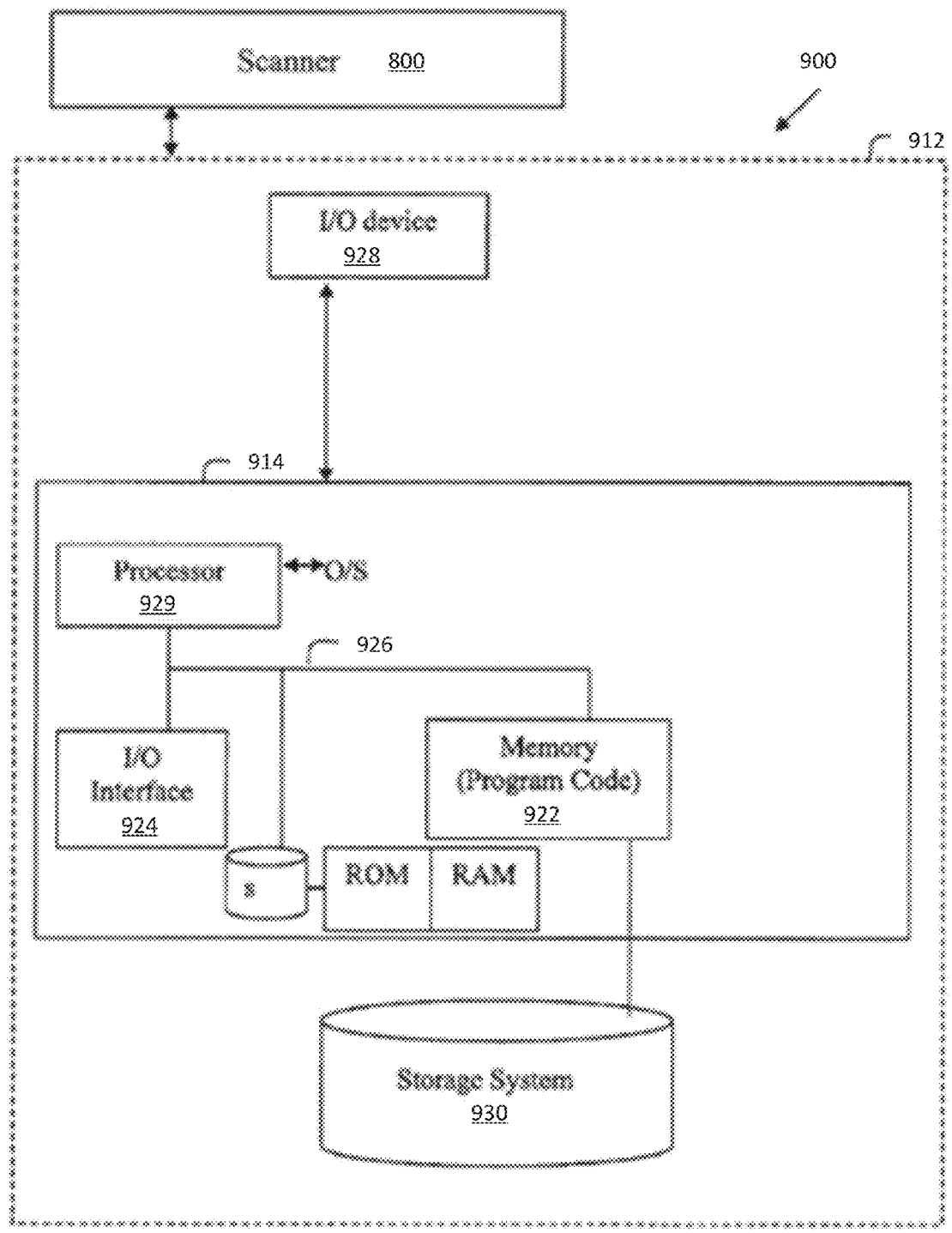
FIG. 9 illustrates an example of environment for implementing the invention according to an embodiment.

FIG. 9 provides an illustration of environment 910 for managing the processes in accordance with the invention. The environment 910 includes a server 912 that can perform the processes described herein using appropriately structured computer program code(s). As should be appreciated by those of skill in the art, the server 912 includes a computing device 914 having one or more processors 920, memory 922, an input-output (I/O) interface 924, and a bus 926. The memory 922 can include local memory employed during actual execution of program code(s), as one non-limiting example. The server 912 and/or computing device 914 are configured to read and/or receive information from the scanner 800, and use this information to predict critical dimensions of the images pattern and placement of its edges across the wafer that is being processed in the scanner 800. As used herein, the terms scanner and scanner apparatus refer to a photolithography apparatus (e.g., imaging system, exposure apparatus, etc.) used in lithography.

The one or more processors 920 may be dedicated processors programmed for execution of particular processes or combination of processes in accordance with the invention, which may be performed on the server 912 and/or the computing device 914. The server 912 and/or computing device 914 may also be dedicated to particular processes or combination of processes in accordance with the invention. Accordingly, the computing device 914 and/or server 912 can include any combination of general and/or specific purpose hardware (e.g., one or more electronic circuits such as dedicated processors 920) and/or computer program code(s). The server 912 and/or computing device 914 are configured to communicate over any type of communications link, such as, for example: wired and/or wireless links; any combination of one or more types of networks (e.g., the Internet, a wide area network, a local area network, a virtual private network, etc.); and/or utilize any combination of transmission techniques and protocols.

The computing device also includes an I/O device 928 that may be external to either the computing device 914 or the server 912. The I/O device 928 can be, for example, a device that is configured to enable an individual (user) to interact with the computing device 914, such as a display equipped with GUI. In embodiments, the user can enter information into the system by way of the GUI (I/O device 928). In one example, the input items can be accessible to the user by a dialog box. In addition, it is contemplated that the I/O device 928 is configured to lead the user through the input requirements by providing input boxes for textual input or pointer action.

By way of illustration, the I/O device 928 is configured to accept data associated with the scanner 800 and reticle/mask R of FIG. 1, amongst other information. The scanner data can include, for example, user-defined laser wavelength, laser bandwidth, laser spectrum, immersion and dry exposure data, a default index of refraction (for water), pupil intensity, immersion exposure, threshold information (e.g., low intensity information from pupilgram files), polarization information, etc. The mask information may include, for example, editing capabilities for amplitude and phase information, etc., as well as accepting GDS or OASIS mask files].

The server 912 (and/or computing device 914) includes a centralized device repository, e.g., tangible, non-transitory storage memory system 930. In embodiments, the centralized device repository 930 is configured and/or designed to store the computer code and library information (data).

The following notes are in order. References made throughout this specification to "one embodiment," "an embodiment," "a related embodiment," or similar language mean that a particular feature, structure, or characteristic described in connection with the referred to "embodiment" is included in at least one embodiment of the present invention. Thus, appearances of these phrases and terms may, but do not necessarily, refer to the same implementation. It is to be understood that no portion of disclosure, taken on its own and in possible connection with a figure, is intended to provide a complete description of all features of the invention.

In addition, the following disclosure may describe features of the invention with reference to corresponding drawings, in which like numbers represent the same or similar elements wherever possible. It is understood that in the drawings, the depicted structural elements are generally not to scale, and certain components may be enlarged relative to the other components for purposes of emphasis and clarity of understanding. It is also to be understood that no single drawing is intended to support a complete description of all features of the invention. In other words, a given drawing is generally descriptive of only some, and generally not all, features of the invention. A given drawing and an associated portion of the disclosure containing a description referencing such drawing do not, generally, contain all elements of a particular view or all features that can be presented is this view, for purposes of simplifying the given drawing and discussion, and to direct the discussion to particular elements that are featured in this drawing. A skilled artisan will recognize that the invention may possibly be practiced without one or more of the specific features, elements, components, structures, details, or characteristics, or with the use of other methods, components, materials, and so forth. Therefore, although a particular detail of an embodiment of the invention may not be necessarily shown in each and every drawing describing such embodiment, the presence of this detail in the drawing may be implied unless the context of the description requires otherwise. In other instances, well known structures, details, materials, or operations may be not shown in a given drawing or described in detail to avoid obscuring aspects of an embodiment of the invention that are being discussed. Furthermore, the described single features, structures, or characteristics of the invention may be combined in any suitable manner in one or more further embodiments.

The invention as recited in claims appended to this disclosure is intended to be assessed in light of the disclosure as a whole, including features disclosed in prior art to which reference is made.

While the description of the invention is presented through the above examples of embodiments, those of ordinary skill in the art understand that modifications to, and variations of, the illustrated embodiments may be made without departing from the inventive concepts disclosed herein.

Figure 10:
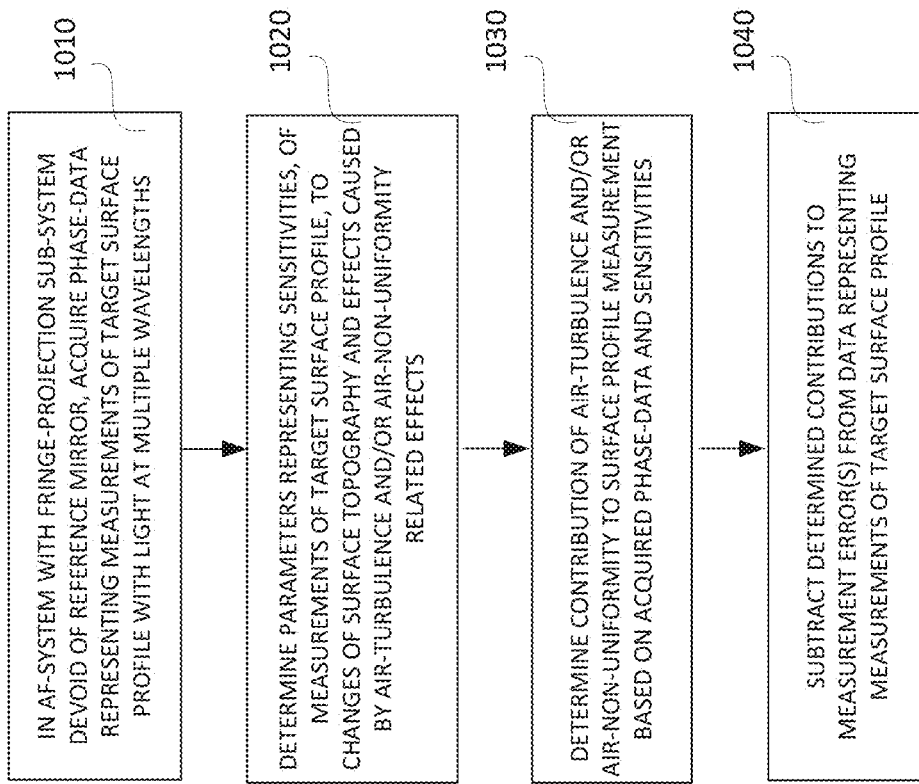
FIG. 10 is a flow-chart illustrating an embodiment of a method of the invention.

For example, an implementation of a method of the invention may include, in reference to FIG. 10: the acquisition, with an AF-system employing a fringe-projection system devoid of a reference mirror, of phase-data representing a profile of the target surface, at step 1010, and the determination of parameters representing sensitivities of the acquisition process to changes in optical path(s) of the measurement beam(s) and/or the changes in the profile of the target surface itself, as step 1020. Such determination may be effectuated with a specifically programmed computer processor, be made at least in part based on the opto-geometrical parameters of the measurement system, and be based only on data derived from light that has interacted with the target surface (in other words, not involve data that is not derived from light that has interacted with the target surface). Thereafter, at step 1030, contributions of air-related effects to the measurement(s) of the target surface profile are calculated based on the acquired phase-data and determined sensitivity values. These contributions are then subtracted from the results of the surface profile measurements at step 1040, thereby removing the empirically-defined error attributed to ATE from the measurement results. The order and labeled steps of the logical flow-chart of FIG. 10 are indicative of one embodiment of the presented method. Other steps and methods may be conceived that are equivalent in function, logic, or effect to one or more steps, or portions thereof, of the illustrated method.

It is understood, therefore, that the present invention is directed to a system that includes a profile-generating element configured to generate a profile of a target surface from optical data derived from two or more selected optical parameters associated with an irradiance pattern formed on the target surface, which optical parameters are selected to be indicative of the ambient air turbulence around the target surface so that profiling errors induced in the generated target surface profile by the ambient air turbulence are at least partially reduced. In a non-exclusive implementation, the profile generating element can include data-processing electronic circuitry (for example, a processor) governed by program code embedded in a non-transitory tangible computer readable medium. One specific non-exclusive implementation of the system will comprise, in such case, a programmable data-processing circuitry; and a tangible, non-transitory storage medium with program code thereon, which code, when used to program the programmable data-processing circuitry, enables said circuitry to generate a profile of a target surface based on optical data representing only two or more optical parameters associated with an irradiance pattern formed on the target surface, the profile being substantially devoid of errors induced by ambient air turbulence around the target surface.

In addition or alternatively, the system may include tangible non-transitory computer-readable medium having a computer program therein, the computer program including a program code which causes the profile-generating element to receive optical data representing the irradiance pattern formed on the target surface; determine two or more optical parameters indicative of the ambient air non-uniformity in proximity to and/or around the target surface; and to determine the profile of the target surface based on such determined optical parameters, where the errors contributed to the determined profile by the air non-uniformity are at least partially reduced.

Disclosed aspects, or portions of these aspects, may be combined in ways not listed above. In view of the numerous possible embodiments to which the principles of the disclosed invention may be applied, the invention should not be viewed as being limited to the disclosed example.

What is claimed is:

1. An apparatus configured to detect a position of a surface, the apparatus comprising:
    a source system, configured and dimensioned to generate
        a first beam of light at a first wavelength directed to the surface through the source system at a first angle, and
        a second beam of light at the first wavelength directed to the surface through the source system at a second angle to form, at the surface, a first irradiation pattern including light from the first and second beams of light,
        wherein the first and second angles differ from one another,
        a third beam of light at a second wavelength directed to the surface through the source system at a third angle, and
        a fourth beam of light at the second wavelength directed to the surface through the source system at a fourth angle to form, at the surface, a second irradiation pattern including light from the third and fourth beams of light,
        wherein the third and fourth angles differ from one another;
    a light-receiving system including an optical detector, the light-receiving system configured to receive light from said first and second irradiation patterns reflected at said surface and to form first and second images, respectively, of said first and second irradiation patterns at the optical detector,
    and
    electronic circuitry configured to determine a position of the surface from an electronic signal generated by the optical detector in response to detection of said first and second images formed thereon, wherein said apparatus is devoid of a reference mirror that is optically coupling the source system and the light-receiving system, and wherein any of (i) said first and second beams of light and (ii) said third and fourth beams of light are employed both as measurement beams and as reference beams.

2. The apparatus of claim 1, wherein the electronic circuitry is further configured to determine, based on said electronic signal, an error in a profile of the surface caused by non-uniformity of ambient air around the surface and adjust the apparatus such as to change two or more of (i) the first wavelength, (ii) the second wavelength; and (iii) a position of an optical component of said apparatus to reduce contribution of said non-uniformity to an error in said position of the surface.

3. The apparatus of claim 2, wherein the electronic circuitry is further configured to determine said error caused by the non-uniformity of ambient air around the surface of the substrate based at least in part on a coefficient of sensitivity of measurement to air-turbulence effects.

4. The apparatus of claim 1, wherein the source system includes:

a light source configured to emit first light containing light at said first and second wavelengths;

a diffraction grating oriented to diffract said first light incident thereon from the light source; and a first optical system positioned to receive said first and second beams formed as a result of diffraction of said first light at the diffraction grating and redirect said first and second beams at said first and second angles to the surface.

5. The apparatus of claim 4, wherein the light-receiving system includes a second optical system configured to form said first and second images on a detecting surface of the detector.

6. The apparatus of claim 5, wherein the electronic circuitry is further configured to determine a contribution of non-uniformity of ambient air around the surface to an error of said position with the use of said electronic signal and data representing at least one of optical and geometrical parameters of at least one of the first and second optical system.

7. The apparatus of claim 5, wherein the first optical system includes a first spatial filter configured to transmit a diffraction beam of a predetermined order, formed at the diffraction grating from said first light;

wherein the second optical system includes a second spatial filter configured to transmit a beam of light reflected at the surface;

and wherein an optical member of at least one of the first and second optical systems is positioned between the first and second spatial filters in an optical path associated with at least one of the first and second beams.

8. The apparatus of claim 6, wherein the data represents chromatic aberration characterizing at least a part of the first and second optical systems.

9. An exposure apparatus configured to expose a predetermined pattern on a substrate, comprising:

the apparatus of claim 1, configured to detect a position of the substrate to be exposed, a first surface of said substrate being said surface; and a surface position adjustor configured to adjust a position of the first surface to a predetermined position.

10. The exposure apparatus of claim 9, further comprising a projection optical system configured to project the predetermined pattern on the substrate, wherein the surface position adjustor is configured to reposition the first surface to an image plane of the projection optical system.

11. A device manufacturing method comprising:

transferring the predetermined pattern onto a target substrate using the exposure apparatus of claim 9; and developing the target substrate on which the predetermined pattern has been transferred during said transferring.

* * * * *